United States Patent
Morizuka et al.

[11] Patent Number: 6,037,619
[45] Date of Patent: Mar. 14, 2000

[54] FIELD EFFECT TRANSISTOR AND HIGH-FREQUENCY POWER AMPLIFIER HAVING SAME

[75] Inventors: Mayumi Morizuka; Yoshiaki Kitaura, both of Kawasaki, Japan

[73] Assignee: Kabushiki Kaisha Toshiba, Kawasaki, Japan

[21] Appl. No.: 09/037,539

[22] Filed: Mar. 10, 1998

[30] Foreign Application Priority Data

Mar. 11, 1997 [JP] Japan ................................. 9-056442

[51] Int. Cl.⁷ .................................................. H01L 29/812
[52] U.S. Cl. ........................................ 257/280; 257/285
[58] Field of Search ................................... 257/280–285

[56] References Cited

U.S. PATENT DOCUMENTS

| | | |
|---|---|---|
| 4,803,526 | 2/1989 | Terada et al. . |
| 5,883,396 | 3/1999 | Reedy et al. ................................. 257/9 |

FOREIGN PATENT DOCUMENTS

| | | |
|---|---|---|
| 61-101080 | 5/1986 | Japan . |
| 1-12579 | 1/1989 | Japan ..................................... 257/280 |
| 1-162378 | 6/1989 | Japan . |
| 3-28059 | 4/1991 | Japan . |
| 3-192732 | 8/1991 | Japan ..................................... 257/280 |
| 7-235553 | 9/1995 | Japan . |

OTHER PUBLICATIONS

Hirose, et al., "A Lightly Doped Deep Drain GaAs MESFET Structure for Linear Amplifiers of Personal Handy–Phone Systems," IEEEE Trans. on Electron Devices, vol. 43, No. 12, Dec. 1996, pp. 2062–2067.

*Primary Examiner*—John Guay
*Attorney, Agent, or Firm*—Oblon, Spivak, McClelland, Maier & Neustadt, P.C.

[57] ABSTRACT

A field effect transistor comprises: a first conductive type active layer formed on a surface region of a semiconductor substrate; first conductive type, source and drain regions formed on the semiconductor substrate on both sides of the gate electrode, the source and drain regions having a higher density of impurity than that of the active layer; and first conductive type, first and second impurity regions formed on the semiconductor substrate between a channel region below the gate electrode and the source region and between the channel region and the drain region, the first and second impurity regions having a depth, which is substantially the same as or deeper than that of those of the source region and the drain region, the first and second impurity regions having a density of impurity, which is higher than that of the channel region and lower than those of source region and the drain region. Thus, it is possible to provide a field effect transistor having a high power conversion efficiency, and it is possible to increase the drain efficiency and the yield as high as possible.

15 Claims, 7 Drawing Sheets

FIELD EFFECT TRANSISTOR AND HIGH-FREQUENCY POWER AMPLIFIER HAVING SAME

BACKGROUND OF THE INVENTION

1. Field of the Invention

The present invention relates generally to a field effect transistor and a high-frequency power amplifier having the same.

2. Description of the Related Art

Metal Semiconductor Field Effect Transistors which will be hereinafter referred to MESFETs, have been used for power amplifiers for portable telephones. The MESFETs of this type generally have a recess structure. However, in recent years, MESFETs having a self alignment structure capable of being operated at a low voltage in lower costs have been used. FIG. 9 shows a conventional MESFET structure having a self alignment structure having a short gate length.

As shown in FIG. 9, a p-type impurity layer 82 for suppressing a short channel effect is formed on a semi-insulating GaAs substrate (also hereinafter referred to as a "substrate") 81. In the surface region of the p-type impurity layer 82, an n-type active layer 83 is formed. On the n-type active layer 83, a Schottky gate electrode 84 is formed. In addition, n-type impurity layers (also hereinafter referred to as "intermediate layers") 86a, 86b are formed in the impurity layer 82 so as to sandwich the gate electrode 84 therebetween. Outside the intermediate layers 86a and 86b in the impurity layer 82, an n-type source region 88a and an n-type drain region 88b are formed.

In the MESFET of this structure, each of the source-side and drain-side intermediate layers 86a, 86b generally has a depth of about half of those of the source region 88a and the drain region 88b and a density of impurity substantially equal to those of the source regions 88a and the drain regions 88b to prevent the potential below the active layer from decreasing to suppress the short channel effect and to decrease the parasitic resistance to achieve a high transconductance and a low source-drain resistance. However, the drain breakdown voltage of the MESFET of this structure is about 6 V, so that it is not sufficient to use it for a power amplifier having a source voltage of about 3 V. Therefore, as shown in FIG. 10, there have been used structures wherein no drain-side intermediate layer 86b is formed and an active layer 83 is elongated to be connected to a drain region 88b to enhance the breakdown voltage (M. Nagaoka, et al., SSDM93, PD-2-1) and wherein a drain-side intermediate layer 86b is elongated (S. Murai, et al., IEEE GaAs IC Symp. Dig., pp139–142, 1992).

However, since these structures are asymmetric structures, there is a problem in that it is required to accurately carry out the mask alignment in the manufacturing process, so that the yield is considerably decreased and the manufacturing costs are increased.

SUMMARY OF THE INVENTION

It is therefore an object of the present invention to eliminate the aforementioned problems and to provide a field effect transistor, which has a high power conversion efficiency and a drain breakdown voltage as high as possible and which can be produced in a yield as high as possible.

It is another object of the present invention to provide a high-frequency power amplifier, which has reliability as high as possible even if a supply voltage fluctuates in a wide range.

In order to accomplish the aforementioned and other objects, according to one aspect of the present invention, a field effect transistor comprises: a first conductive type active layer formed on a surface region of a semiconductor substrate; first conductive type, source and drain regions formed on the semiconductor substrate on both sides of the gate electrode, the source and drain regions having a higher density of impurity than that of the active layer; and first conductive type, first and second impurity regions formed on the semiconductor substrate between a channel region below the gate electrode and the source region and between the channel region and the drain region, the first and second impurity regions having a depth, which is substantially the same as or deeper than that of those of the source region and the drain region, the first and second impurity regions having a density of impurity, which is higher than that of the channel region and lower than those of source region and the drain region.

According to another aspect of the present invention, a field effect transistor comprises: a first conductive type active layer formed on a surface region of a semiconductor substrate; first conductive type, source and drain regions formed on the semiconductor substrate on both sides of the gate electrode, the source and drain regions having a higher density of impurity than that of the active layer; and first conductive type, first and second impurity regions formed on the semiconductor substrate between a channel region below the gate electrode and the source region and between the channel region and the drain region, the first and second impurity regions having a density of impurity, which is higher than that of the channel region and lower than those of source region and the drain region, wherein the maximum carrier density is generated at a position different from the position of the maximum current density.

The density of impurity in each of the first and second impurity regions may be in the range of from ½ to ¹⁄₁₀ of those of the source region and the drain region.

A second conductive type impurity layer, which has a different conductive type from the first conductive type, may be formed on the semiconductor substrate below the first and second impurity regions.

Each of the first and second impurity regions has a length ranging from 0.4 $\mu$m to 0.7 $\mu$m.

According to a further aspect of the present invention, a high-frequency power amplifier comprises: first through n th ($\geq 2$) field effect transistors, a drain of each of the first through n th field effect transistors being connected to a first power supply via a choke coil, and a source of each of the first through n th field effect transistors being connected to a second power supply, a gate of the first field effect transistor receiving an input signal, the drain of the i th (i=1, ... n−1) field effect transistor being connected to the gate of the i+1 th field effect transistor, and the drain of the n th field effect transistor outputting an output signal.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1:
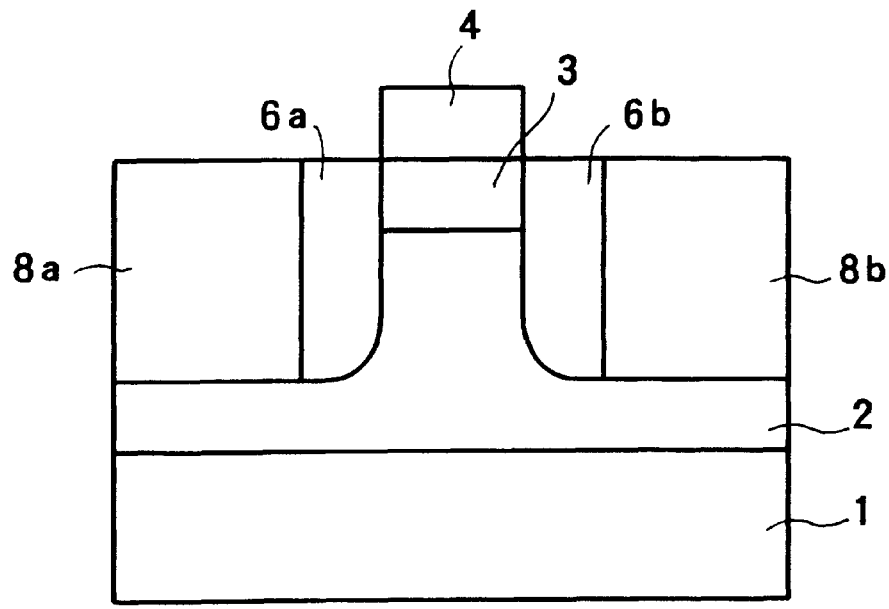
FIG. 1 is a sectional view of the first preferred embodiment of a field effect transistor according to the present invention.

FIG. 1 shows the first preferred embodiment of a field effect transistor according to the present invention. In this preferred embodiment, the field effect transistor is a MESFET, which comprises, as shown in FIG. 1, a semi-insulating GaAs substrate 1, a p-type impurity layer 2 formed thereon for suppressing a short channel effect, an n-type active layer 3 formed in the surface region of the impurity layer 2, and a Schottky gate electrode 4 of, e.g., tungsten nitride, formed on the active layer 3.

In addition, n-type impurity layers (also hereinafter referred to as "intermediate density region") 6a, 6b are formed in the impurity layer 2 so as to sandwich the gate electrode 4 therebetween. Outside the intermediate density layers 6a and 6b in the impurity layer 2, an n-type source region 8a and an n-type drain region 8b are formed. On the source region 8a and the drain region 8b, a source electrode (not shown) and a drain electrode (not shown) are formed.

The source region 8a and the drain region 8b have a higher density of impurity than that of the active layer 3, and are formed more deeply than the active layer 3. The intermediate density regions 6a and 6b have an intermediate density of impurity between the density of impurity of the source and drain regions 8a, 8b and the density of impurity of the active layer 3, and are formed so as to have substantially the same depth as those of the source region 8a and the drain region 8b, or so as to be more deeply than the source region 8a and the drain region 8b.

A process for producing the MESFET in the first preferred embodiment will be described below.

First, a p-type impurity layer 2 is formed on a semi-insulating GaAs substrate 1 by selectively ion-implanting a p-type impurity, e.g., Mg, so as to have a peak density of $5 \times 10^{16}$ cm$^{-3}$ at a depth of 0.2 $\mu$m. Then, an n-type active layer 3 is formed thereon by selectively ion-implanting an n-type impurity, e.g., Si, so as to have a peak density of $8 \times 10^{17}$ cm$^{-3}$ at a depth of 0.025 $\mu$m. Moreover, on the active layer 3, a Schottky gate electrode 4 of a refractory metal, e.g., tungsten nitride, is formed so as to have a length of 0.8 $\mu$m. Thereafter, an n-type source-side intermediate density layer 6a and an n-type drain-side intermediate density layer 6b are formed so as to be self-aligned by ion-implanting an n-type impurity, e.g., Si, using the gate electrode 4 as a mask so as to have a peak density of $3 \times 10^{17}$ cm$^{-3}$ at a depth of 0.1 $\mu$m.

Then, on both sides of the gate electrode 4, SiO$_2$ side walls (not shown) having a thickness of, e.g., 0.3 $\mu$m, are formed. Using these side walls as masks, a source region 8a and a drain region 8b are formed so as to be self aligned by ion-implanting a n-type impurity so as to have a peak density of $2 \times 10^{18}$ cm$^{-3}$ at a depth of 0.1 $\mu$m. This basic manufacturing process is the same as that for the conventional BP-LDD (Buried P-layer-Lightly Doped Drain) structure shown in FIG. 9. In this process, all of the active layer 3, the source-side intermediate density layer 6a, the drain-side intermediate density layer 6b, the source region 8a and the drain region 8b are formed so as to be self aligned with the gate electrode 4. Therefore, it makes possible mass production of MESFETs with a uniform characteristic in a high yield without the need of the mask alignment with high accuracy.

Figure 9:
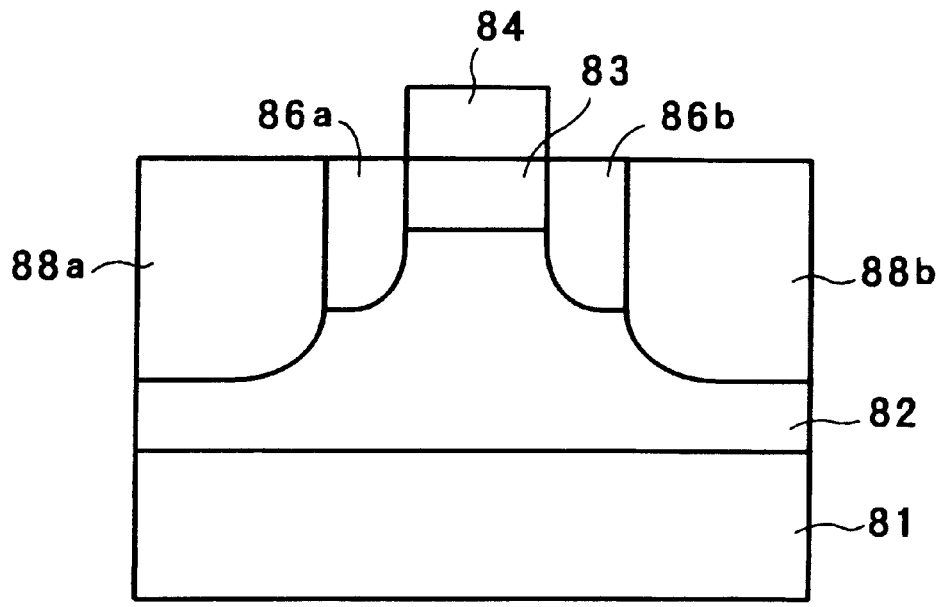
FIG. 9 is a sectional view of a conventional MESFET structure.
Figure 10:
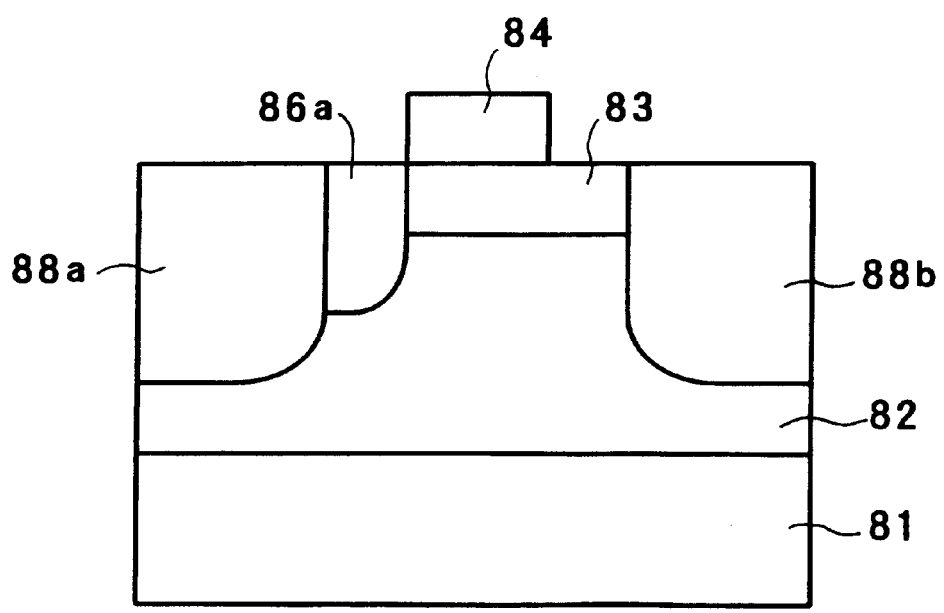
FIG. 10 is a sectional view of another conventional MESFET structure.

The characteristics of the MESFET in this preferred embodiment thus formed were compared with the characteristics of the conventional MESFET having the BP-LDD structure shown in FIG. 9 and the characteristics of the MESFET having the asymmetrical structure shown in FIG. 10, which is used for a power amplifier (also hereinafter referred to as "PA") for PHS. The compared results are shown in Table 1.

TABLE 1

|  | First Embodiment | Conventional BP-LDD Structure | Conventional Element for PA |
|---|---|---|---|
| Threshold Voltage | −0.3V | −0.3V | −0.3V |
| Drain Breakdown voltage | 7.8V | 5.6V | 7.9V |
| Transconductance | 340mS/mm | 340mS/mm | 310mS/mm |
| Source-Drain Resistance | 2.7$\mu$ | 2.5$\mu$ | 3.1$\mu$ |
| Yield | 80% | 80% | 55% |

As can be seen from Table 1, the structure in this preferred embodiment has a drain breakdown voltage, which is higher than that of the conventional BP-LDD structure and which can be sufficiently used for PA for PHS. The transconductance of the structure in this preferred embodiment is so high as to be the same as that of the conventional BP-LDD structure and higher than that of the conventional element for PA. The source-drain resistance of the structure in this preferred embodiment is substantially the same as that of the conventional BP-LDD structure and lower than that of the element for PA. Therefore, it is expected that the structure in this preferred embodiment can be used as an element having a higher efficiency than that of the conventional element for PA. The yield of the structure in this preferred embodiment is higher than that of the conventional element for PA, so that it is verified that the structure in this preferred embodiment can produced at lower costs.

The reason why the structure in this preferred embodiment has a higher drain breakdown voltage than that of the conventional BP-LDD structure is as follows. The drain breakdown voltage is determined by carriers generated by the impact ionization and so forth. This impact ionization phenomenon is the fact that the number of generated carriers increases if the current density increases in a high field intensity region. As can be seen from the simulated results of the distribution of generated carriers shown in FIG. 3, in the case of the conventional MESFET having the BP-LDD structure, both of the electric field intensity and the current density are increased in the drain-side intermediate density layer, so that the generation rate of carrier increases. For example, the density of generated carriers is $10^{22}$ cm$^{-3}$s$^{-1}$ in the drain-side intermediate density layer. Furthermore, in FIG. 3, the distribution of generated carriers is expressed by contour lines for the density of generated carriers.

Therefore, in this preferred embodiment, the current density of the drain-side intermediate density region 6b having a high field intensity is decreased by increasing the depth of the intermediate density region, so that it is possible to inhibit carriers from being generated to increase the breakdown voltage.

In this preferred embodiment, the current density is decreased in the drain-side intermediate density layer 6b, which has the highest field intensity in the MESFET when the drain voltage is increased, to cause current to flow broadly in a depth direction, so that the breakdown voltage becomes high without increasing the parasitic drain resistance. If the source-side intermediate density region 6a has the same structure as that of the drain-side intermediate density region 6b, the MESFET has a symmetric structure, so that it is possible to utilize the advantages of the self aligning gate to produce the MESFET without the need of the mask alignment with high accuracy and it is also possible to reduce the parasitic source resistance thereof.

Figure 2:
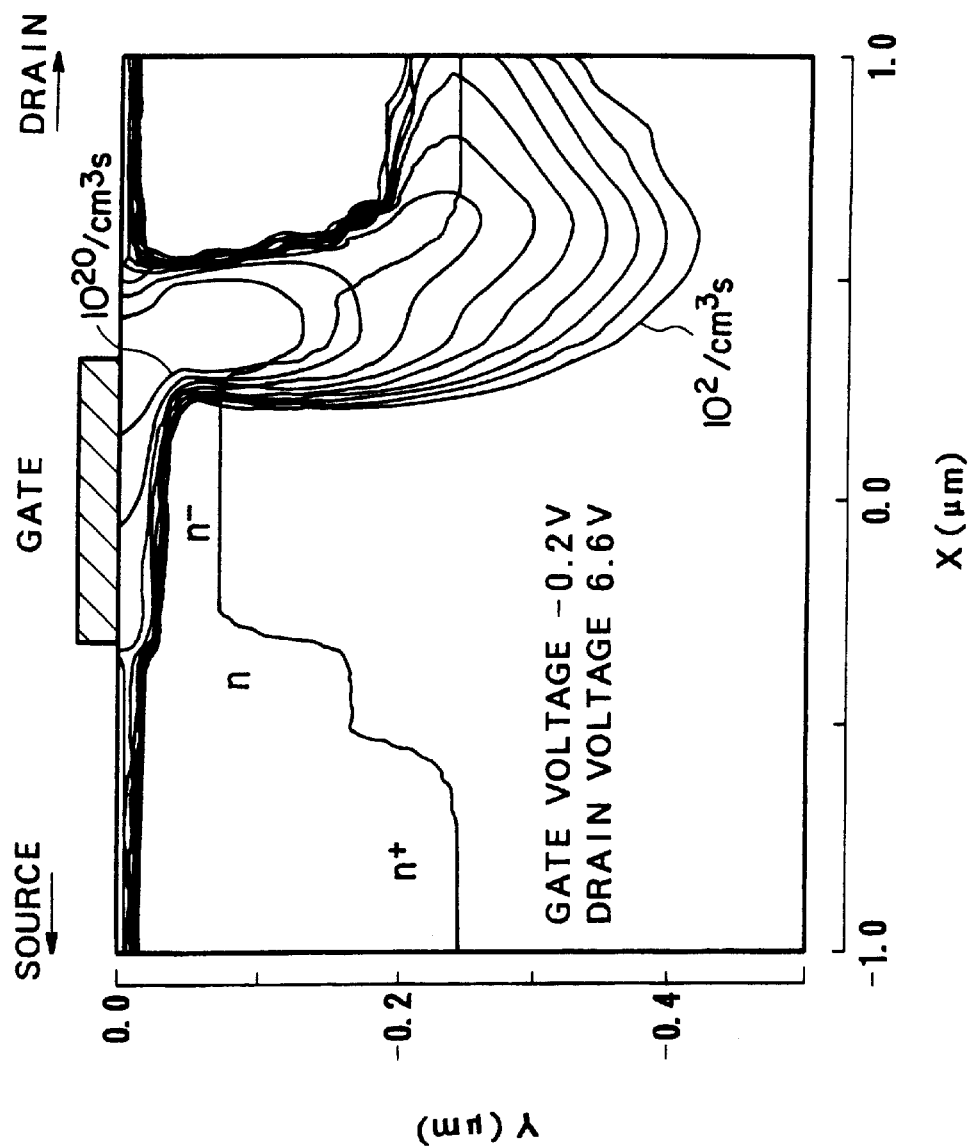
FIG. 2 is a figure showing a distribution of generated carriers of the transistor in the first preferred embodiment.

This can be also seen from the simulated results shown in FIG. 2. FIG. 2 shows the simulated results of the distribution of generated carriers in the first preferred embodiment of a MESFET according to the present invention. In FIG. 2, the distribution of generated carriers is shown by contour lines for the density of generated carriers. As can be seen from FIG. 2, in the case of the MESFET in the first preferred embodiment, the maximum number of generated carriers in the drain-side intermediate density region 6b is $10^{20}$ cm$^{-3}$s$^{-2}$, which is lower than that of the conventional MESFET having the BP-LDD structure by two figures. Thus, the breakdown voltage is increased.

In the first preferred embodiment, the intermediate density layers 6a, 6b were formed so as to have depths, which are substantially the same as or deeper than those of the source regions 8a, 8b. This means that the position of the maximum carrier density is different from the position of the maximum current density (which is outside of the depletion layer of the Schottky junction and inside of the intermediate density layer 6b).

Figure 3:
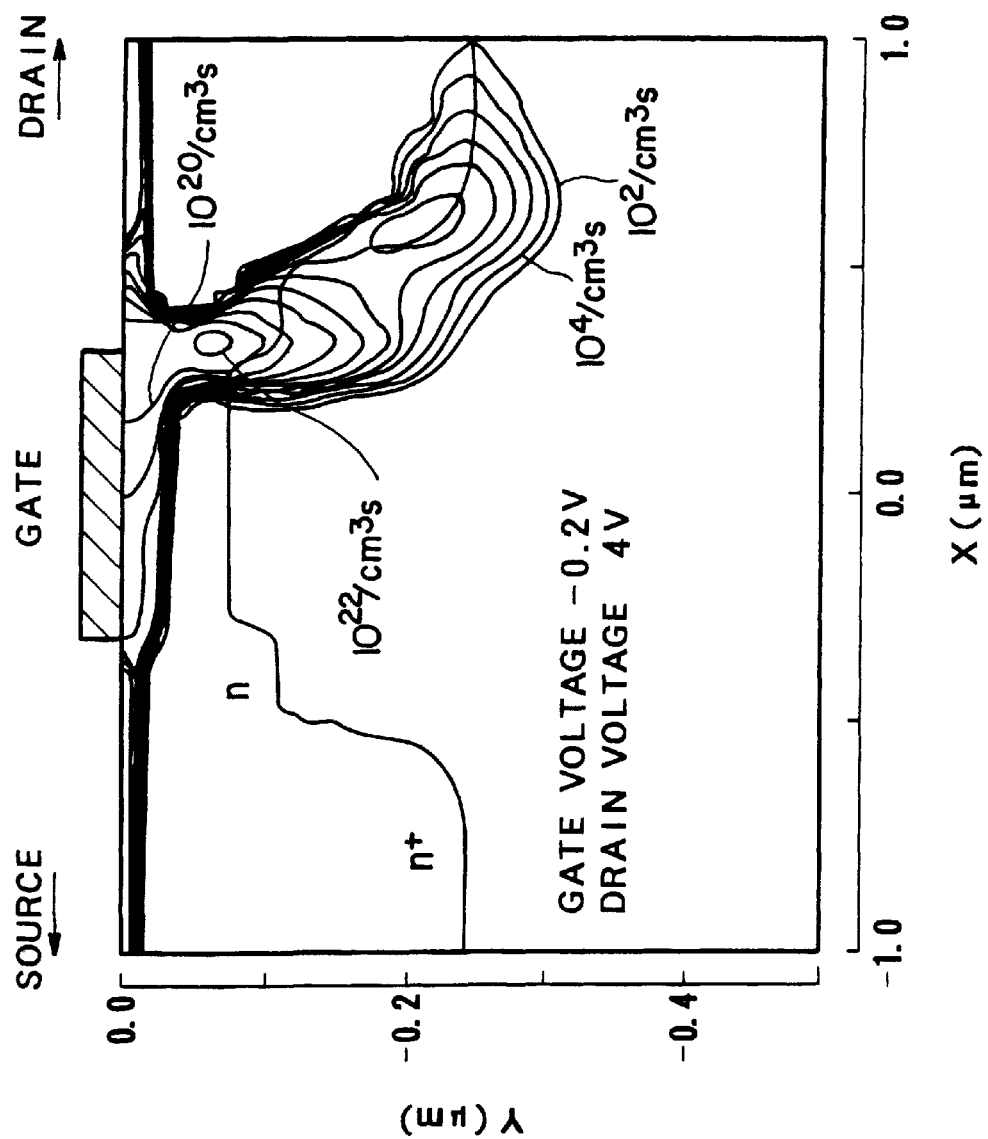
FIG. 3 is a figure showing a distribution of generated carriers of a conventional transistor having a BP-LDD structure.

In the case of the conventional MESFET, since the position of the maximum carrier density is the same as the position of the maximum current density as shown in FIG. 3, there is a problem in that the breakdown voltage is low. On the other hand, in the first preferred embodiment, since the position of the maximum carrier density is arranged at a position different from the position of the maximum current density, e.g., near the interface between the gate and the intermediate density layer 6b, the breakdown voltage can be increased.

Figure 4:
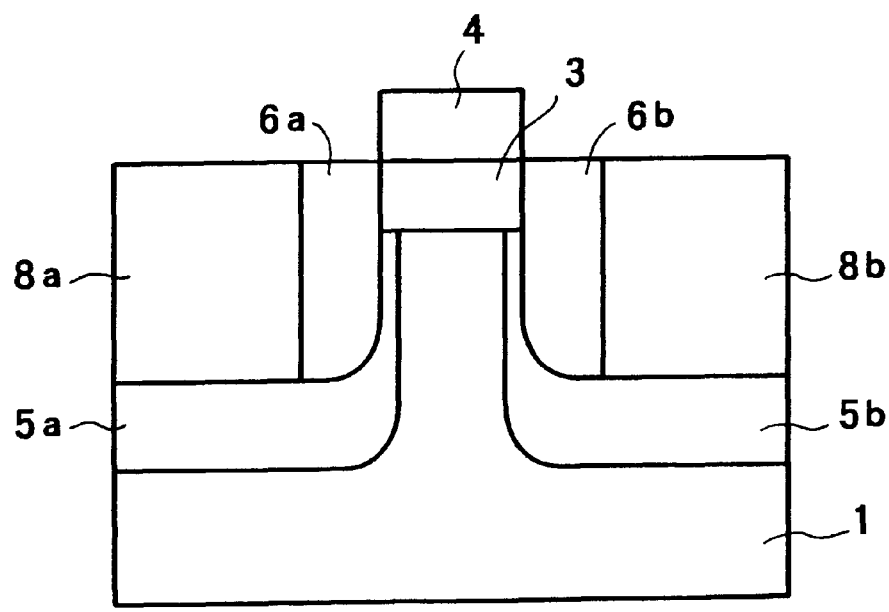
FIG. 4 is a sectional view of the second preferred embodiment of a transistor according to the present invention.

FIG. 4 shows the second preferred embodiment of a transistor according to the present invention. In this preferred embodiment, the p-type impurity layer 2 of the transistor in the first preferred embodiment shown in FIG. 1 is not formed below an active layer 3, and p-type impurity layers (which will be also hereinafter referred to as "p-type layers") 5a, 5b are formed in a region of a substrate 1, which includes junctions between intermediate density regions 6a, 6b, a source regions 8a and a drain regions 8b and a substrate 1.

With this construction, the potential below the active layer 3 is not higher than that in the first preferred embodiment, so that the same threshold voltage can be obtained in a lower dose. Thus, it is possible to reduce the electric field intensity on the interface of a gate electrode 4 in comparison with the transistor in the first preferred embodiment, and it is possible to decrease carriers generated by the impact ionization, so that it is possible to further increase the drain breakdown voltage.

The transistor in the second preferred embodiment can be produced by the same process as that of the transistor in the first preferred embodiment, except for the formation of the p-type layers 5a, 5b. The p-type layers 5a, 5b, which are formed so as to surround the intermediate density regions 6a, 6b, the source region 8a and the drain region 8b, can be formed by ion-implanting a p-type impurity so as to have a peak density is, e.g., $5 \times 10^{16}$ cm$^{-3}$ at a depth is, e.g., 0.2 μm, after forming the gate electrode 4. The performance of the FET thus produced is shown in Table 2.

TABLE 2

|  | First Embodiment | Second Embodiment | Conventional Element for PA |
|---|---|---|---|
| Threshold Voltage | −0.3V | −0.4V | −0.3V |
| Drain Breakdown voltage | 7.8V | 8.5V | 7.9V |
| Transconductance | 340mS/mm | 290mS/mm | 310mS/mm |
| Source-Drain Resistance | 2.7μ | 2.9 0μ | 3.1μ |
| Yield | 80% | 80% | 55% |

Comparing the first preferred embodiment with the second preferred embodiment, the drain breakdown voltage in the second preferred embodiment is higher than that in the first preferred embodiment, and the transconductance in the first preferred embodiment is higher than that in the second preferred embodiment. It is said that the efficiency of a FET generally increases as the drain breakdown voltage increases and as the transconductance increases. Considering that the FET is applied to a PHS system of 1.9 GHz, it is required that the efficiency is high as well as the adjacent channel leakage power is sufficiently low. Comparing the maximum efficiency of the MESFET in the first preferred embodiment with that of the MESFET in the second preferred embodiment, the former was 37% and the latter was 47%, so that the MESFET in the second preferred embodiment had a higher efficiency than that in the first preferred embodiment. Since the conventional element has the maximum efficiency of 35%, the MESFET in the second preferred embodiment could improve the yield as well as the efficiency in comparison with the conventional element.

In the above described preferred embodiments, while the p-type layer has been formed below the active layer or around the source-side and drain-side intermediate density regions 6a, 6b and the source and drain regions 8a, 8b, the same advantages can be obtained if no p-type layer is formed when the gate length is long.

In the first and second preferred embodiments, the MESFET can be applied to a power amplifier in the system of supply voltage of 3 V, because it has a drain breakdown voltage of higher than or equal to 7.8 V. However, even if an average supply voltage is 3 V, the supply voltage at the beginning of use is in the range of from 3.3 V to 4.5 V, which is far higher than 3 V. In such a high supply voltage state, the drain breakdown voltage is not sufficient.

Therefore, the inventor studied the influence on the drain breakdown voltage and the transconductance when the lengths of the intermediate density regions 6a, 6b were changed in the MESFET in the first and second preferred embodiments. Referring to FIG. 5 and 6A through 6C, the studied results will be described.

Figure 5:
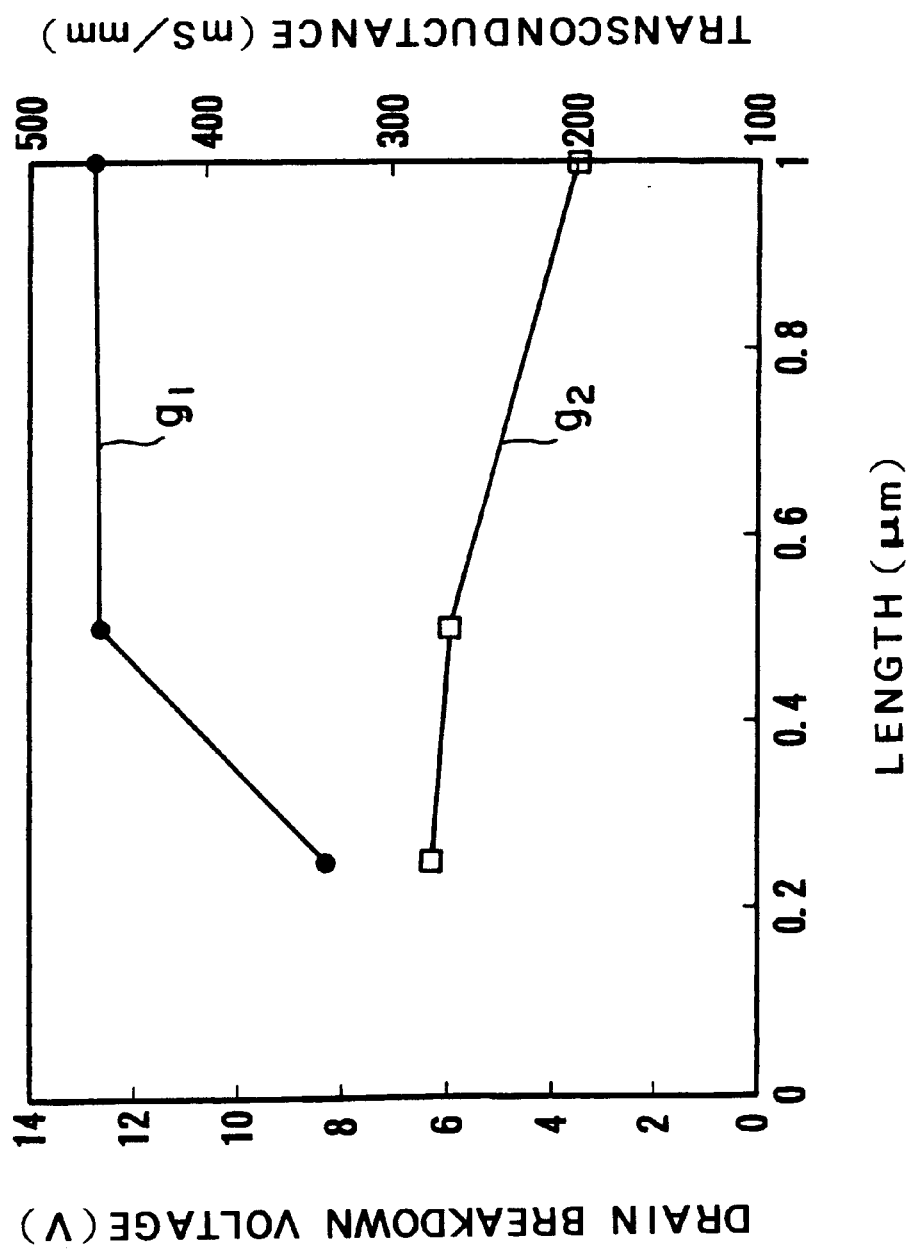
FIG. 5 is a graph showing a drain breakdown voltage and a transconductance characteristic with respect to the length of an intermediate density region.

If the lengths of the intermediate density layers were increased from 0.25 μm to 0.5 μm, the drain breakdown voltage was increased from 8.4 V to 12.7 V (see g1 in FIG. 5). On the other hand, the transconductance was decreased only slightly, i.e., from 280 mS/mm to 270 mS/mm (see g2 in FIG. 5). However, even if the lengths of the intermediate density regions 6a, 6b were further increased to 1 μm, the drain breakdown voltage was hardly changed, and the transconductance was decreased to 200 mS/mm. Therefore, in this example, if the length of each of the intermediate density regions 6a, 6b is 0.5 μm, it is possible to obtain the highest breakdown voltage and high transconductance.

Figure 6A:
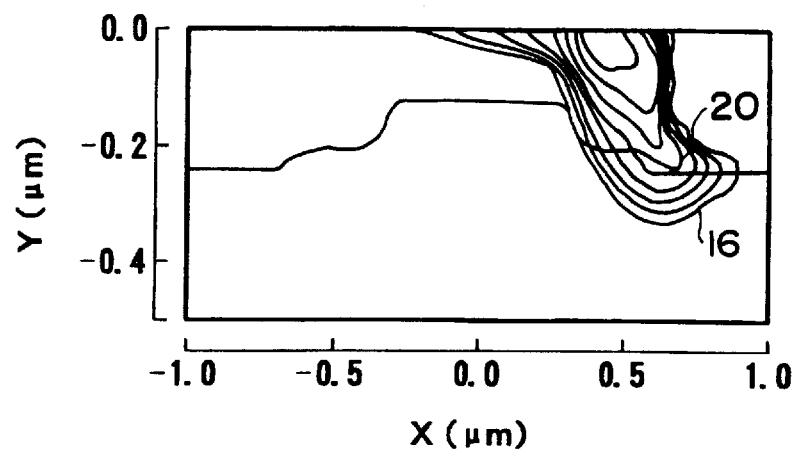
FIGS. 6A through 6C are figures showing distributions of generated carriers in intermediate density regions having different lengths.
Figure 6B:
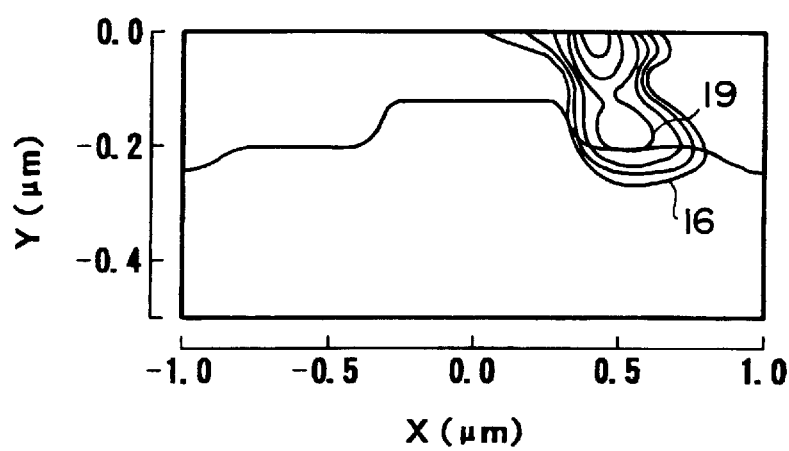
Figure 6C:
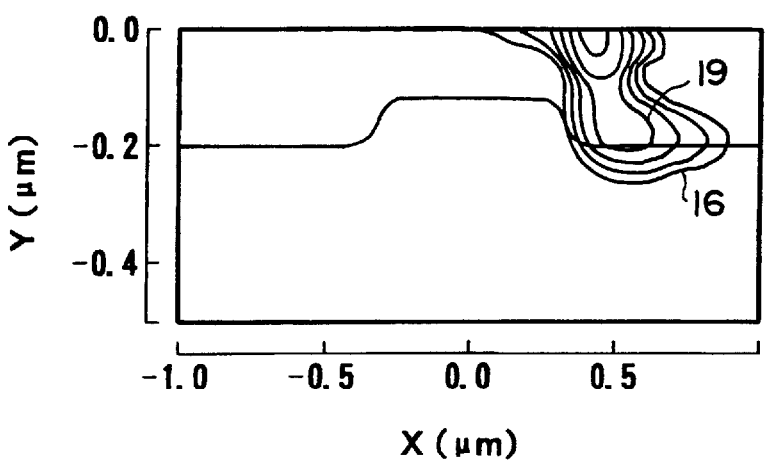

The reason why the drain breakdown voltage increases if the lengths of the intermediate density regions 6a, 6b are increased is as follows. FIGS. 6A through 6C show the results obtained by simulating carriers generated by the impact ionization in the element by means of a two-dimensional device model. FIGS. 6A, 6B and 6C show the simulated results of the MESFET when the length of each of the intermediate density regions 6a, 6b is 0.25 μm, 0.5 μm and 1.0 μm, respectively. The drain voltage is 9 V, and the gate voltage is −0.2 V in all cases. In these Figures, contour lines show exponents of higher than or equal to 16 every 1. That is, in these Figures, 16 means $10^{16}$ cm$^{-3}$s$^{-1}$. These contour lines also show the interface between the n-type layer and the p-type layers 6a, 6b or the substrate 1.

In FIG. 6A, a region having a X-coordinate of 0.4 to 0.65 μm and a Y-coordinate of 0 to −0.2 μm corresponds to the drain-side intermediate layer. The carriers generated by the impact ionization are mainly generated in this region, and the number of the generated carriers is high, $10^{23}$ cm$^{-3}$s$^{-1}$.

On the other hand, in FIG. 6B, a region having a X-coordinate of 0.4 to 0.9 μm corresponds to the drain-side intermediate layer. In this region, the number of the generated carriers in the intermediate density regions 61, 6b is lower than that shown in FIG. 6A by about one figure. The number of carriers generated at the drain end of the gate is also lower by one figure to have the order of $10^{22}$. It was considered that it was possible to decrease the field intensity in the X direction in this region to suppress the impact ionization by increasing the lengths of the intermediate density regions 6a, 6b.

In FIG. 6C, a region having a X-coordinate of 0.4 to 1.4 μm corresponds to the drain-side intermediate density region 6b. The state of the generated carriers is substantially the same as that in FIG. 6B. Because the field contributing to the impact ionization extends in current directions, so that the fields in the X direction as well as in the Y direction must be considered. In the intermediate density regions 6a, 6b, there are a Y-direction field caused by a ununiform density of impurity in the Y direction, and a Y-direction field caused by negative charges by the surface states. Such electric field intensities are not changed by varying the length of the intermediate density region. Therefore, even if the lengths of the intermediate density regions 6a, 6b are increased to reduce the field intensity in the X direction, the field intensity in the Y direction remains being a constant intensity, so that the decrease of the impact ionization is limited. Therefore, even if the lengths of the intermediate density regions 6a, 6b are increased, it is considered that the carrier generation in FIG. 6C is the same as that in FIG. 6B and the breakdown voltage is not increased.

On the other hand, the transconductance reduces by increasing the lengths of the intermediate density regions 6a, 6b since the sheet carrier density of the source-side intermediate density region 6a is lower than that of the source region 8a. As the length of intermediate density region 6a increases, the parasitic source resistance increases and the transconductance decreases.

In the above example, the optimum length of the intermediate density region was 0.5 μm. However, the optimum length varies in accordance with the distribution of density of impurity in the intermediate density region. Considering the range of conditions generally prepared by the ion implantation, the optimum length is in the range of from 0.4 to 0.7 μm.

As described above, since it is possible to produce a GaAs MESFET having a high breakdown voltage and a high transconductance, it is possible to provide a power amplifier, which always operates at a high efficiency even if the supply voltage varies in a wide range of from 3 V to 4.5 V. In addition, this element can provide various high-frequency analog circuits, such as a switch and a low noise amplifier. Moreover, these circuits can be integrated in a single chip to form an analog integrated circuit.

Figure 7:
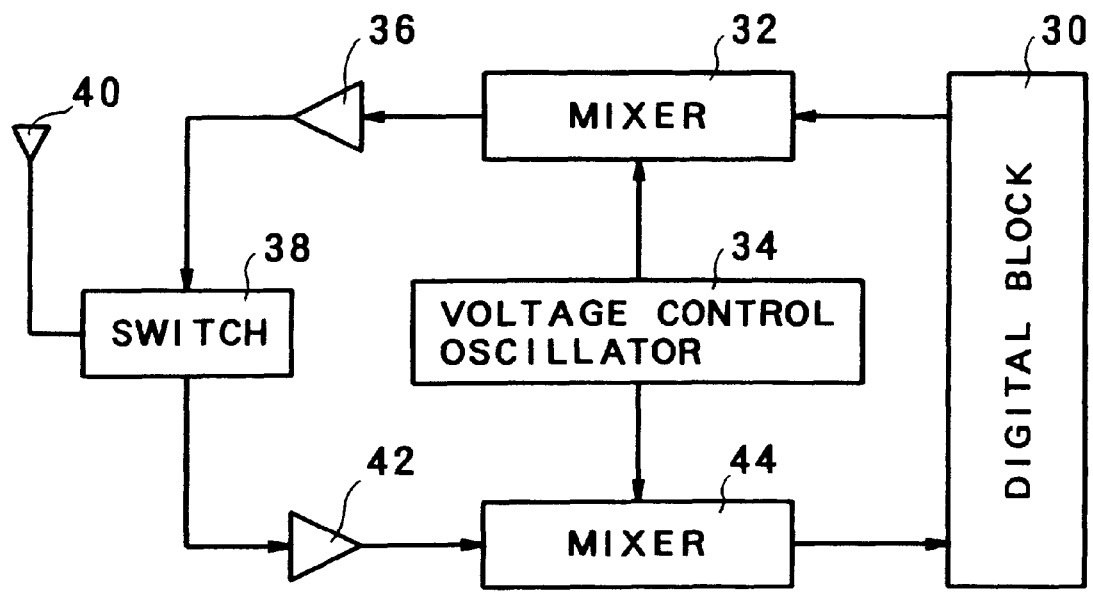
FIG. 7 is a block diagram of a portable terminal unit.
Figure 8:
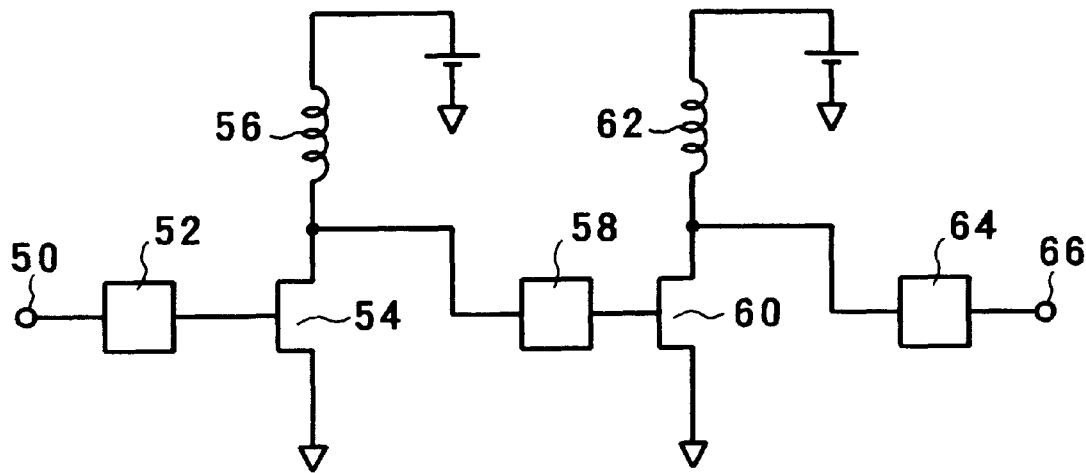
FIG. 8 is a circuit diagram of a high-frequency power amplifier.

Referring to FIGS. 7 and 8, a high-frequency power amplifier for a potable radio terminal, to which the MESFET in the first or second preferred embodiment is applied, will be described below.

FIG. 7 is a block diagram of a principal part of a mobile communication system. In FIG. 7, reference number 30 denotes a digital block. During transmitting, the digital block 30 converts an analog signal, which is inputted from a microphone (not shown) or the like to be transmitted, into a digital signal, and band-compresses the digital signal by a signal processing technique. During receiving, the digital block 30 band-extends the received digital signal by a signal processing technique to convert the band-extended digital signal into an analog signal to output a signal for driving a speaker (not shown). Reference number 32 denotes a mixer for modulating a signal to be transmitted. The mixer 32 receives the band-compressed digital signal outputted from the digital block 30, and performs the π/4 shift QPSK modulation and so forth of the received signal using a local oscillation signal of 1.9 MHz outputted from a voltage control oscillator 34, to output the modulated output to a high-frequency power amplifier 36 prepared by a MMIC (Monolithic Microwave Integrated Circuit). A signal amplified to a transmission power by the high-frequency power amplifier 36 is transmitted to an antenna 40 via a switch 38 for switching the transmitting/receiving. The antenna 40 is driven to transmit a signal.

On the other hand, during receiving, the signal received by the antenna 40 is inputted to a low noise amplifier 42 via the switch 38. The inputted signal is amplified by the low noise amplifier 42 so as to have a desired signal level, and then, the amplified signal is outputted to a mixer 44. The mixer 44 detects and demodulates the received signal using a local oscillation signal outputted from the voltage control oscillator 34, to output the detected and demodulated signal to the digital block 30.

The mobile communication system has a keyboard (not shown) for keying, and a power supply circuit (not shown) having a primary or secondary cell as a power supply. In this embodiment, the high-frequency power amplifier 36 is prepared by the MMIC. On the MMIC, the switch 38, the low noise amplifier 42 and so forth may be mounted.

FIG. 8 is a circuit diagram illustrating the detailed structure of the high-frequency power amplifier 36. The transmitted signal modulated by the mixer 32 is supplied to an input terminal 50. The transmitted signal is supplied to the gate of a front stage MESFET 54 via a well-known impedance matching circuit 52 for impedance matching. The source of the MESFET 54 is grounded. To the drain of the MESFET 54, a source potential of, e.g., 3 V, is supplied via a choke coil 56. This source potential corresponds to a supply voltage of, e.g., a lithium ion secondary cell, mounted on the mobile communication system. The drain of the MESFET 54 is supplied to the gate of a rear stage MESFET 60 via a well-known interstage matching circuit 58 for impedance matching between the front stage and the rear stage. Similar to the front stage MESFET 54, the source of the MESFET 60 is grounded, and a source potential is supplied to the drain of the MESFET 60 via a choke coil 62. The drain of the rear stage MESFET 62 is connected to an output terminal 66, which is connected to the switch 38, via a well-known impedance matching circuit 64 for impedance matching. The above described field effect transistors of the present invention may bee used for the MESFETs 54 and 60.

While the high-frequency power amplifier has comprised two stage MESFETs, it may comprise multi-stage MESFETs of three stages or more if necessary. In this case, a desired number of MESFETs may be provided between the drain of the front stage MESFET 54 and the gate of the subsequent MESFET 60 so that the gates of the respective MESFETs are connected to the drains of the MESFETs immediately upstream thereof. If necessary, interstage matching circuits may be provided between the gates of the respective MESFETs and the drains of the MESFETs immediately upstream thereof.

As described above, a field effect transistor according to the present invention can have a high power conversion efficiency, and can increase the drain breakdown voltage and the yield as high as possible.

A high-frequency power amplifier circuit according to the present invention can have high reliability even if the supply voltage fluctuates in a wide range.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A field effect transistor comprising:
    a first conductivity type active layer formed on a surface region of a semiconductor substrate;
    a gate electrode formed on said active layer;
    first conductivity type source and drain regions formed on said semiconductor substrate on both sides of said gate electrode, said source and drain regions having a higher density of impurity than that of said active layer; and
    first conductivity type, first and second impurity regions formed on said semiconductor substrate between said active layer and said source region and between said active layer and said drain region, said first and second impurity regions having a density of impurity, which is higher than that of said active region and lower than those of said source region and said drain region,
    wherein each of said first and second regions has first and second peaks in its own impurity concentration profile of depth direction, said first peak being located above a bottom surface of said active layer, and said second peak being located below said bottom surface.

2. A field effect transistor as set forth in claim 1, wherein said density of impurity in each of said first and second impurity regions is in the range of from ½ to ⅒ of those of said source region and said drain region.

3. A field effect transistor as set forth in claim 1, wherein a second conductivity type impurity layer, which has a different conductivity type from said first conductivity type, is formed on said semiconductor substrate below said first and second impurity regions.

4. A field effect transistor as set forth in claim 1, wherein each of said first and second impurity regions has a length ranging from 0.4 μm to 0.7 μm.

5. A field effect transistor comprising: a first conductivity type active layer formed on a surface region of a semiconductor substrate;
    a gate electrode formed on said active layer;
    first conductivity type, source and drain regions formed on said semiconductor substrate on both sides of said gate electrode, said source and drain regions having a higher density of impurity than that of said active layer; and
    first conductivity type, first and second impurity regions formed on said semiconductor substrate between said active layer and said source region and between said active layer and said drain region, said first and second impurity regions having symmetric impurity concentration profiles in a depth direction such that the density of impurity in both the first and second impurity regions is higher than that of said active layer and lower than said source region and said drain region,
    wherein the position of maximum carrier density is different from the position of maximum current density.

6. A field effect transistor as set forth in claim 5, wherein said first and second impurity regions has a depth, which is substantially the same as or deeper than that of those of said source region and said drain region.

7. A field effect transistor as set forth in claim 5, wherein said density of impurity in each of said first and second impurity regions is in the range of from ½ to ⅒ of those of said source region and said drain region.

8. A field effect transistor as set forth in claim 5, wherein a second conductivity type impurity layer, which has a different conductivity type from said first conductivity type, is formed on said semiconductor substrate below said first and second impurity regions.

9. A field effect transistor as set forth in claim 5, wherein each of said first and second impurity regions has a length ranging from 0.4 μm to 0.7 μm.

10. A field effect transistor as set forth in claim 6, wherein said density of impurity in each of said first and second impurity regions is in the range of from ½ to ⅒ of those of said source region and said drain region.

11. A field effect transistor as set forth in claim 6, wherein a second conductivity type impurity layer, which has a different conductivity type from said first conductivity type, is formed on said semiconductor substrate below said first and second impurity regions.

12. A field effect transistor as set forth in claim 6, wherein each of said first and second impurity regions has a length ranging from 0.4 μm to 0.7 μm.

13. A high-frequency power amplifier comprising:
    first through n th ($\geq 2$) field effect transistors as set forth in claim 1,
    a drain of each of said first through n th field effect transistors being connected to a first power supply via a choke coil, and a source of each of said first through n th field effect transistors being connected to a second power supply,
    a gate of said first field effect transistor receiving an input signal, said drain of said i th (i=1, . . . , n−1) field effect transistor being connected to said gate of said i+1 th field effect transistor, and said drain of said n th field effect transistor outputting an output signal.

14. A high-frequency power amplifier comprising:

first through n th ($\geq$2) field effect transistors as set forth in claim 5, a drain of each of said first through n th field effect transistors being connected to a first power supply via a choke coil, and a source of each of said first through n th field effect transistors being connected to a second power supply, a gate of said first field effect transistor receiving an input signal, said drain of said i th (i=1, . . . , n−1) field effect transistor being connected to said gate of said i+1 th field effect transistor, and said drain of said n th field effect transistor outputting an output signal.

15. A high-frequency power amplifier comprising:

first through n th ($\geq$2) field effect transistors as set forth in claim 6, a drain of each of said first through n th field effect transistors being connected to a first power supply via a choke coil, and a source of each of said first through n th field effect transistors being connected to a second power supply, a gate of said first field effect transistor receiving an input signal, said drain of said i th (i=1, . . . , n−1) field effect transistor being connected to said gate of said i+1 th field effect transistor, and said drain of said n th field effect transistor outputting an output signal.

* * * * *